(12) United States Patent
Takase

(10) Patent No.: US 12,306,272 B2
(45) Date of Patent: May 20, 2025

(54) SENSOR DEVICE WITH BIAS VOLTAGE CORRECTION TO COMPENSATE FOR CHANGE IN CHARACTERISTICS OF BRIDGE CIRCUIT

(71) Applicant: Murata Manufacturing Co., Ltd., Nagaokakyo (JP)

(72) Inventor: Yasuhide Takase, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 115 days.

(21) Appl. No.: 18/228,014

(22) Filed: Jul. 31, 2023

(65) Prior Publication Data

US 2023/0375645 A1    Nov. 23, 2023

Related U.S. Application Data

(63) Continuation of application No. PCT/JP2022/002525, filed on Jan. 25, 2022.

(30) Foreign Application Priority Data

Feb. 16, 2021 (JP) .................... 2021-022367

(51) Int. Cl.
*G01R 27/02* (2006.01)
*G01R 17/12* (2006.01)
*G01R 33/09* (2006.01)

(52) U.S. Cl.
CPC ............. *G01R 33/09* (2013.01); *G01R 17/12* (2013.01)

(58) Field of Classification Search
CPC ................................ G01R 33/09; G01R 17/12
See application file for complete search history.

(56) References Cited

U.S. PATENT DOCUMENTS

| 3,913,392 A | 10/1975 | Nagase et al. |
| 5,419,199 A | 5/1995 | Araki |
| 5,460,050 A | 10/1995 | Miyano |
| 2003/0184327 A1 | 10/2003 | Makino |

(Continued)

FOREIGN PATENT DOCUMENTS

| JP | 5647484 B2 | 11/1981 |
| JP | 62185137 A | 8/1987 |
| JP | 01110343 U | 7/1989 |

(Continued)

OTHER PUBLICATIONS

International Search Report in PCT/JP2022/002525, mailed Apr. 12, 2022, 3 pages.

(Continued)

*Primary Examiner* — Alesa Allgood
(74) *Attorney, Agent, or Firm* — Keating & Bennett, LLP

(57) ABSTRACT

In a sensor device, a bias circuit includes a bias voltage generation circuit, a regulator circuit, an impedance calculation circuit, and a bias voltage correction circuit. The bias voltage generation circuit generates a bias voltage required to operate the bridge circuit. The regulator circuit applies the bias voltage to the bridge circuit and monitors a bias current supplied to the bridge circuit. The impedance calculation circuit receives a value of the bias voltage and a value of the bias current and calculates an impedance of the bridge circuit. Based on the impedance, the bias voltage correction circuit causes the bias voltage to be corrected to a voltage that compensates for a change in characteristics of the bridge circuit.

15 Claims, 3 Drawing Sheets

(56) References Cited

U.S. PATENT DOCUMENTS

2015/0177280 A1    6/2015  Berringer

FOREIGN PATENT DOCUMENTS

| | | | |
|---|---|---|---|
| JP | 05256716 | A | 10/1993 |
| JP | 0634387 | A | 2/1994 |
| JP | 0719807 | A | 1/1995 |
| JP | 08105913 | A | 4/1996 |
| JP | 09218118 | A | 8/1997 |
| JP | 2000186968 | A | 7/2000 |
| JP | 2001091387 | A | 4/2001 |
| JP | 2003294559 | A | 10/2003 |
| JP | 2014098577 | A | 5/2014 |
| JP | 2018031630 | A | 3/2018 |

OTHER PUBLICATIONS

Written Opinion in PCT/JP2022/002525, mailed Apr. 12, 2022, 3 pages.

SENSOR DEVICE WITH BIAS VOLTAGE CORRECTION TO COMPENSATE FOR CHANGE IN CHARACTERISTICS OF BRIDGE CIRCUIT

CROSS REFERENCE TO RELATED APPLICATIONS

This application claims the benefit of priority to Japanese Patent Application No. 2021-022367 filed on Feb. 16, 2021 and is a Continuation Application of PCT Application No. PCT/JP2022/002525 filed on Jan. 25, 2022. The entire contents of each application are hereby incorporated herein by reference.

BACKGROUND OF THE INVENTION

1. Field of the Invention

The present invention relates to a sensor device to compensate for a change in characteristics of a bridge circuit including a sensor element.

2. Description of the Related Art

Examples of a sensor device of this type in the related art include the pressure sensor in the pump for liquid chromatograph disclosed in Japanese Unexamined Patent Application Publication No. 2018-31630.

This pressure sensor includes a bridge circuit in which four resistors are bridge-connected. The bridge circuit is driven at a constant current, and the input voltage and output voltage of the bridge circuit are measured. A correction unit acquires the temperature of the bridge circuit on the basis of an input voltage value measured by an input voltage detection unit and data representing the relationship between a temperature and an input voltage. The accurate pressure value of a mobile phase ejected from a pump unit is obtained on the basis of the acquired temperature of the bridge circuit and a calibration table indicating the relationship between an output voltage and a pressure at each temperature. A correction unit corrects the value of an output voltage transmitted from an output voltage detection unit to a value corresponding to the obtained pressure value.

SUMMARY OF THE INVENTION

In the sensor device in the related art disclosed in Japanese Unexamined Patent Application Publication No. 2018-31630, the gain of an amplification circuit in the correction unit needs to be changed for the correction of an output voltage value transmitted from the output voltage detection unit. However, when a variable gain amplification circuit for which gains are discretely set is used as the amplification circuit, discontinuous noise is superimposed on the output voltage of the amplification circuit. When a variable gain amplification circuit for which a gain is set using a linear analog voltage signal is used, the output voltage of the amplification circuit is likely to be distorted. Accordingly, the use of these variable gain amplification circuits for the correction of the output voltage of the bridge circuit leads to the deterioration of detection output accuracy of the sensor device.

A preferred embodiment of the present invention provides a sensor device including a bridge circuit including at least one sensor, characteristics of which change in accordance with a detected physical quantity, a detection signal reception circuit to receive a sensor detection signal that is output from a detection signal output end of the bridge circuit in accordance with a change in characteristics of the sensor, a bias voltage generation circuit to generate a bias voltage required for an operation of the bridge circuit, a regulator circuit to apply a bias voltage generated by the bias voltage generation circuit to a bias end of the bridge circuit and monitor a bias current supplied to the bridge circuit, an impedance calculation circuit to receive a value of a bias voltage generated by the bias voltage generation circuit and a value of a bias current monitored by the regulator circuit and calculate an impedance of the bridge circuit, and a bias voltage correction circuit to cause, based on an impedance of the bridge circuit calculated by the impedance calculation circuit, a bias voltage generated by the bias voltage generation circuit to be corrected to a voltage that compensates for a change in characteristics of the bridge circuit.

With this configuration, the regulator circuit applies a bias voltage generated by the bias voltage generation circuit to the bias end of the bridge circuit. A bias voltage generated by the bias voltage generation circuit is corrected to a voltage with which the change in the characteristics of the bridge circuit is compensated for based on the output of the bias voltage correction circuit based on the impedance of the bridge circuit calculated by the impedance calculation circuit. The bridge circuit outputs a voltage obtained by computing the product of a voltage, which is applied to the bias end and with which the change in the characteristics of the bridge circuit is compensated for, and the resistance ratio between resistors included in the bridge circuit.

Accordingly, since the bridge circuit itself functions as a multiplication circuit alternative to a variable gain amplification circuit in the related art, even if the characteristics thereof change for some reason, the need to cause a variable gain amplification circuit causing the deterioration of detection output accuracy to amplify and correct a sensor detection signal output to the detection signal output end is eliminated unlike in the past.

Accordingly, preferred embodiments of the present invention can provide sensor devices with which the deterioration of detection output accuracy does not occur even if the characteristics of a bridge circuit change for some reason.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Sensor devices according to preferred embodiments of the present invention will be described.

Figure 1:
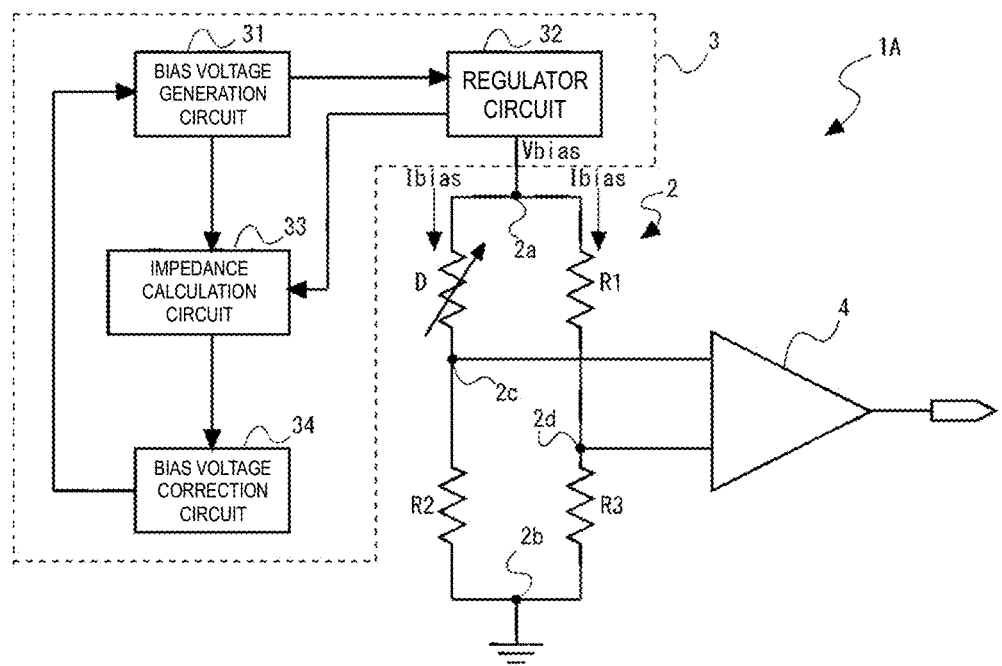
FIG. 1 is a circuit diagram illustrating the schematic configuration of a sensor device according to a first preferred embodiment of the present invention.

FIG. 1 is a circuit diagram illustrating the schematic configuration of a sensor device 1A according to a first preferred embodiment of the present invention.

The sensor device 1A includes a bridge circuit 2, a bias circuit 3, and a detection signal reception circuit 4.

The bridge circuit 2 defines a sensor and includes three resistors R1, R2, and R3 and a single sensor element D which are bridge-connected in the present preferred embodiment. It is sufficient that the bridge circuit 2 include the at least one sensor element D. Accordingly, for example, the bridge circuit 2 may include the four sensor elements D that are bridge-connected. The sensor element D includes, for example, a magnetic resistance element, the characteristics of which change in accordance with a detected physical quantity and has, for example, an electrical resistance value that changes in accordance with the change in an ambient magnetic field due to a magnetic resistance effect. In the drawing, this sensor element D is represented by a resistor symbol with an arrow indicating that the resistance value of the sensor element D changes in accordance with a detected physical quantity.

A node between the sensor element D and a resistor R1 defines a bias end 2a to which the bias circuit 3 applies a bias voltage Vbias. A node between resistors R2 and R3 defines a bias end 2b that is connected to the ground. A node between the sensor element D and the resistor R2 and a node between the resistors R1 and R3 define detection signal output ends 2c and 2d, respectively, at which the change in a physical quantity detected by the sensor element D appears as a sensor detection signal s. In the present preferred embodiment, the respective resistance values of the sensor element D and the three resistors R1, R2, and R3 are set such that a voltage of a predetermined ratio to the bias voltage Vbias appears at each of the detection signal output ends 2c and 2d.

The detection signal reception circuit 4 receives the sensor detection signal s that is output from each of the detection signal output ends 2c and 2d of the bridge circuit 2 in accordance with the change in the characteristics of the sensor element D. In the present preferred embodiment, the detection signal reception circuit 4 includes an amplification circuit to receive the sensor detection signal s output from each of the detection signal output ends 2c and 2d and amplifying it, and outputs an analog detection output signal S obtained by amplifying the sensor detection signal s.

The bias circuit 3 includes a bias voltage generation circuit 31, a regulator circuit 32, an impedance calculation circuit 33, and a bias voltage correction circuit 34 and excites the bridge circuit 2. The bias voltage generation circuit 31 generates the bias voltage Vbias required for the operation of the bridge circuit 2. The regulator circuit 32 applies the bias voltage Vbias generated by the bias voltage generation circuit 31 to the bias ends 2a and 2b of the bridge circuit 2 and monitors a bias current Ibias supplied to the bridge circuit 2. The impedance calculation circuit 33 receives a value vx of the bias voltage Vbias generated by the bias voltage generation circuit 31 and a value ix of the bias current Ibias monitored by the regulator circuit 32 and calculates an impedance Z (=vx/ix) of the bridge circuit 2. The bias voltage correction circuit 34 causes, based on the impedance Z of the bridge circuit 2 calculated by the impedance calculation circuit 33, the bias voltage Vbias generated by the bias voltage generation circuit 31 to be corrected to a voltage Vbiasx with which the change in the characteristics of the bridge circuit 2 is compensated for.

In the sensor device 1A according to the present preferred embodiment, the regulator circuit 32 applies the bias voltage Vbias generated by the bias voltage generation circuit 31 to the bias ends 2a and 2b of the bridge circuit 2. The bias voltage Vbias generated by the bias voltage generation circuit 31 is corrected to the voltage Vbiasx with which the change in the characteristics of the bridge circuit 2 is compensated for based on the output of the bias voltage correction circuit 34 based on the impedance Z of the bridge circuit 2 calculated by the impedance calculation circuit 33. The bridge circuit 2 outputs to the detection signal output ends 2c and 2d a voltage obtained by computing the product of the voltage Vbiasx, which is applied to the bias ends 2a and 2b and with which the change in the characteristics of the bridge circuit 2 is compensated for, and the resistance ratio between the resistors included in the bridge circuit 2.

Accordingly, since the bridge circuit 2 itself functions as a multiplication circuit alternative to a variable gain amplification circuit in the related art even if the characteristics thereof change for some reason, the need to cause a variable gain amplification circuit causing the deterioration of detection output accuracy to amplify and correct the sensor detection signals s output to the detection signal output ends 2c and 2d is eliminated unlike in the past. The sensor device 1A can therefore be provided which is capable of performing sensitivity correction in accordance with the change in the characteristics of the bridge circuit 2 even if the change in the characteristics occurs and which does not cause the deterioration of detection output accuracy. As a result, the accurate detection output signal S is always output from the sensor device 1A in accordance with the change in a physical quantity detected by the sensor element D.

Figure 2:
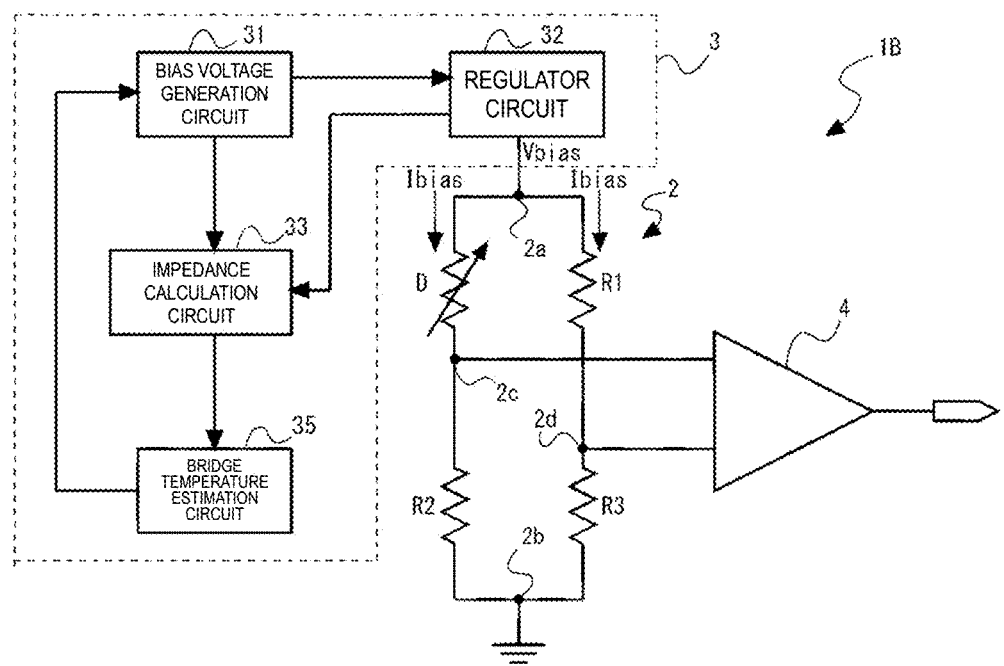
FIG. 2 is a circuit diagram illustrating the schematic configuration of a sensor device according to a second preferred embodiment of the present invention.

FIG. 2 is a circuit diagram illustrating the schematic configuration of a sensor device 1B according to a second preferred embodiment of the present invention. Referring to this drawing, the same reference numerals are used to identify the same components or equivalent components in FIG. 1 and the description of such components is omitted.

The sensor device 1B differs from the above sensor device 1A according to the first preferred embodiment only in that the bias voltage correction circuit 34 is defined by a bridge temperature estimation circuit 35 in the bias circuit 3.

The bridge temperature estimation circuit 35 defines a bias voltage correction circuit to detect a temperature T of the bridge circuit 2 based on the impedance Z of the bridge circuit 2 calculated by the impedance calculation circuit 33 and causing, based on the detected temperature T of the bridge circuit 2, the bias voltage Vbias generated by the bias voltage generation circuit 31 to be corrected to the voltage Vbiasx with which the change in the characteristics of the bridge circuit 2 due to a temperature change is compensated for. The bridge temperature estimation circuit 35 performs conversion from the detected impedance Z of the bridge circuit 2 to the temperature T of the bridge circuit 2 using an arithmetic expression to calculate the temperature T from the impedance Z or a table storing in advance the relationship between the impedance Z and the temperature T. The bias voltage generation circuit 31 receives the temperature T of the bridge circuit 2 detected by the bridge temperature estimation circuit 35 and corrects the bias voltage Vbias generated thereby to the compensation voltage Vbiasx based on the temperature T of the bridge circuit 2 using an arithmetic expression to calculate the compensation voltage Vbiasx from the temperature T or a table storing in advance the relationship between the temperature T and the compensation voltage Vbiasx.

In the sensor device 1B according to the present preferred embodiment, the bridge temperature estimation circuit 35 corrects the bias voltage Vbias generated by the bias voltage generation circuit 31 to the voltage Vbiasx with which the change in the characteristics of the bridge circuit 2 due to a temperature change is compensated for based on the impedance Z calculated by the impedance calculation circuit 33 as described above. Accordingly, even if the characteristics of the bridge circuit 2 change in accordance with a temperature change, the bridge circuit 2 itself functions as a multiplication circuit alternative to a variable gain amplification circuit causing the deterioration of detection output accuracy in such a manner that the bias voltage Vbias applied to the bias ends 2a and 2b is corrected to the voltage Vbiasx with which the change in the characteristics due to a temperature change is compensated for. The sensor device 1B therefore outputs the accurate detection output signal S in accordance with the change in a physical quantity detected by the sensor element D without the deterioration of detection output accuracy even if the characteristics of the bridge circuit 2 change in accordance with a temperature change. As a result, the dependence of bridge sensitivity on temperature is continuously and accurately corrected.

Figure 3:
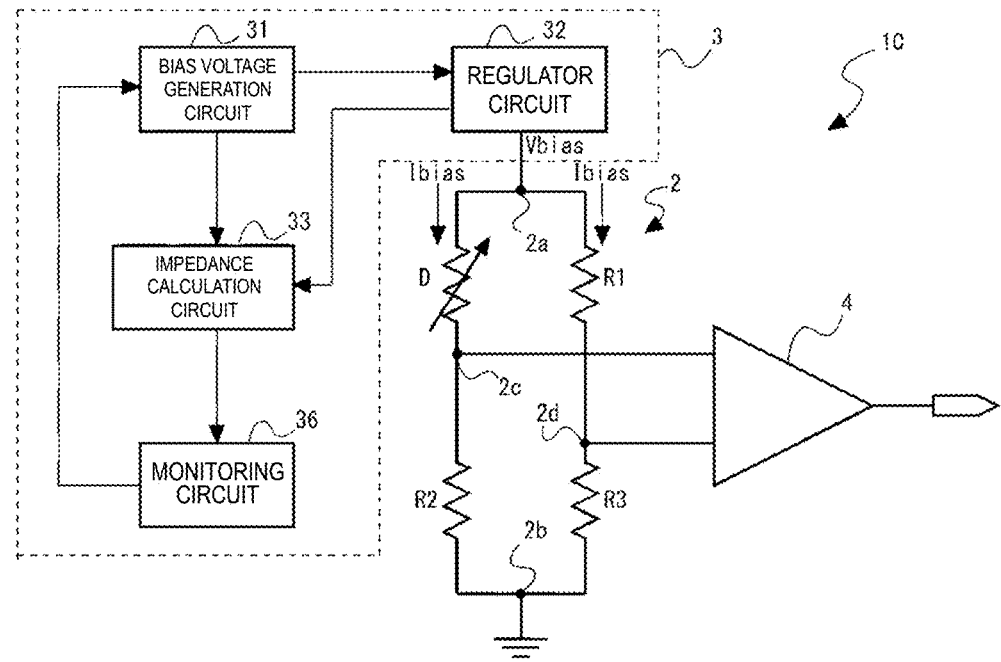
FIG. 3 is a circuit diagram illustrating the schematic configuration of a sensor device according to a third preferred embodiment of the present invention.

FIG. 3 is a circuit diagram illustrating the schematic configuration of a sensor device 1C according to a third preferred embodiment of the present invention. Referring to this drawing, the same reference numerals are used to identify the same components or equivalent components in FIG. 1 and the description of such components is omitted.

The sensor device 1C differs from the above sensor device 1A according to the first preferred embodiment only in that the above bias voltage correction circuit 34 is defined by a monitoring circuit 36 in the bias circuit 3.

The monitoring circuit 36 defines a bias voltage correction circuit to detect the secular change of the bridge circuit 2 based on the impedance Z of the bridge circuit 2 calculated by the impedance calculation circuit 33 and causing, based on the detected secular change of the bridge circuit 2, the bias voltage Vbias generated by the bias voltage generation circuit 31 to be corrected to the voltage Vbiasx with which the change in the characteristics of the bridge circuit 2 due to a secular change is compensated for. The respective impedances Z of the resistors R1 to R3 and the sensor element D included in the bridge circuit 2 change in accordance with a secular change. The monitoring circuit 36 detects a secular change from the detected impedance Z of the bridge circuit 2 using an arithmetic expression to calculate a secular change from the impedance Z or a table storing in advance the relationship between the impedance Z and a secular change. An arithmetic expression to calculate a secular change from the impedance Z or a table storing in advance the relationship between the impedance Z and a secular change may be configured to use a temperature signal output from a temperature sensor (not illustrated) as an additional input to separate the influence of aged deterioration and the influence of a temperature from each other. The bias voltage generation circuit 31 receives the secular change of the bridge circuit 2 detected by the monitoring circuit 36 and corrects, based on the secular change of the bridge circuit 2, the bias voltage Vbias generated thereby to the compensation voltage Vbiasx using an arithmetic expression to calculate the compensation voltage Vbiasx from a secular change or a table storing in advance between a secular change and the compensation voltage Vbiasx.

In the sensor device 1C according to the present preferred embodiment, the monitoring circuit 36 corrects the bias voltage Vbias generated by the bias voltage generation circuit 31 to the voltage Vbiasx with which the change in the characteristics of the bridge circuit 2 due to a secular change is compensated for based on the impedance Z calculated by the impedance calculation circuit 33 as described above. Accordingly, even if the characteristics of the bridge circuit 2 change in accordance with a secular change, the bridge circuit 2 itself functions as a multiplication circuit alternative to a variable gain amplification circuit causing the deterioration of detection output accuracy in such a manner that the bias voltage Vbias applied to the bias ends 2a and 2b is corrected to the voltage Vbiasx with which the change in the characteristics due to a secular change is compensated for. Even if the characteristics of the bridge circuit 2 change in accordance with a secular change, the sensor device 1C therefore outputs the accurate detection output signal S in accordance with the change in a physical quantity detected by the sensor element D without the deterioration of detection output accuracy while keeping sensitivity constant.

In the sensor device 1C according to the above preferred embodiment, the monitoring circuit 36 may be configured to detect the failure of the bridge circuit 2 based on the impedance Z of the bridge circuit 2 calculated by the impedance calculation circuit 33. In this case, when the failure of the bridge circuit 2 is detected, the application of the bias voltage Vbias can be stopped or a notification to a higher-level system can be made. For example, in the case where the impedance Z of the bridge circuit 2 calculated by the impedance calculation circuit 33 is extremely high, the monitoring circuit 36 determines that the bridge circuit 2 has failed. Subsequently, the application of the bias voltage Vbias is stopped or a notification to a higher-level system is made. With this configuration, the failure of the bridge circuit 2 can be detected, the monitoring circuit 36 can output the notification that the bridge circuit 2 has failed, and a quick response to the failure of the bridge circuit 2 can be prompted.

Figure 4:
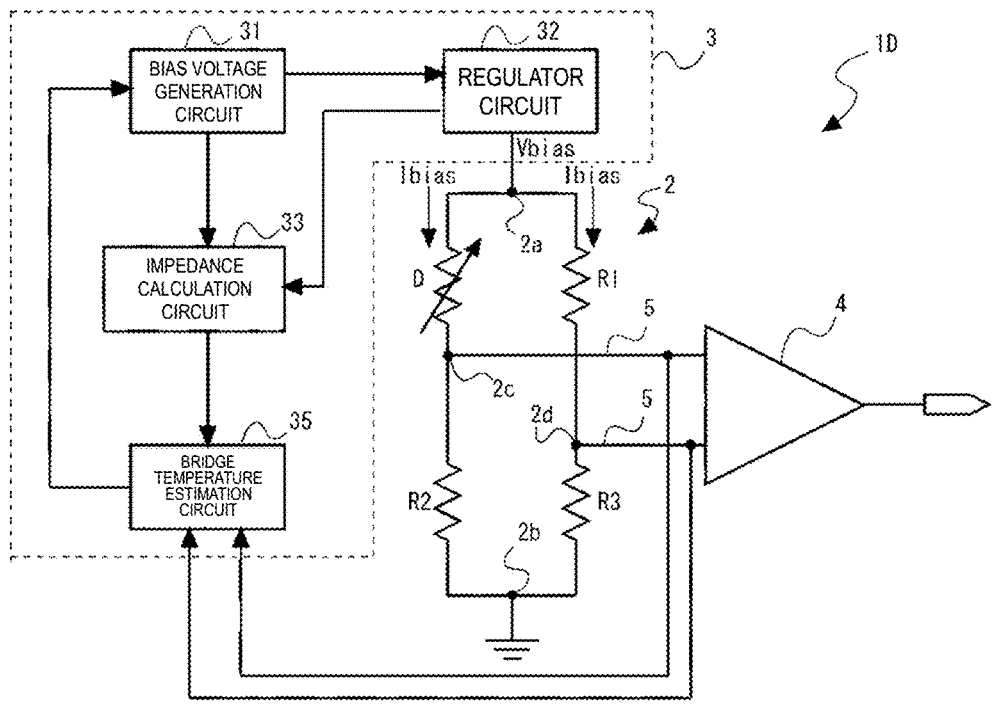
FIG. 4 is a circuit diagram illustrating the schematic configuration of a sensor device according to a fourth preferred embodiment of the present invention.

FIG. 4 is a circuit diagram illustrating the schematic configuration of a sensor device 1D according to a fourth preferred embodiment of the present invention. Referring to this drawing, the same reference numerals are used to identify the same components or equivalent components in FIG. 2 and the description of such components is omitted.

The sensor device 1D differs from the sensor device 1B according to the second preferred embodiment only in that the bridge temperature estimation circuit 35 is connected to a signal input end of the detection signal reception circuit 4 and the abnormal state of a wiring line 5 between the bridge circuit 2 and the detection signal reception circuit 4 is monitored based on a voltage input to the signal input end of the detection signal reception circuit 4.

In the sensor device 1D, the bridge temperature estimation circuit 35 monitors the abnormal state of the wiring line 5 between the bridge circuit 2 and the detection signal reception circuit 4 and can, for example, stop the application of the bias voltage Vbias or output a notification to a higher-level system like the above monitoring circuit 36 when the abnormal state of the wiring line 5 (e.g., the disconnection of the wiring line 5) is monitored. The sensor device 1D therefore outputs the accurate detection output signal S in accordance with the change in a physical quantity detected by the sensor element D without the deterioration of detection output accuracy even if the characteristics of the bridge circuit 2 change in accordance with a temperature change and also can prompt a quick response to the abnormal state of the wiring line 5 by, for example, outputting a notification when the abnormal state of the wiring line 5 is monitored.

Figure 5:
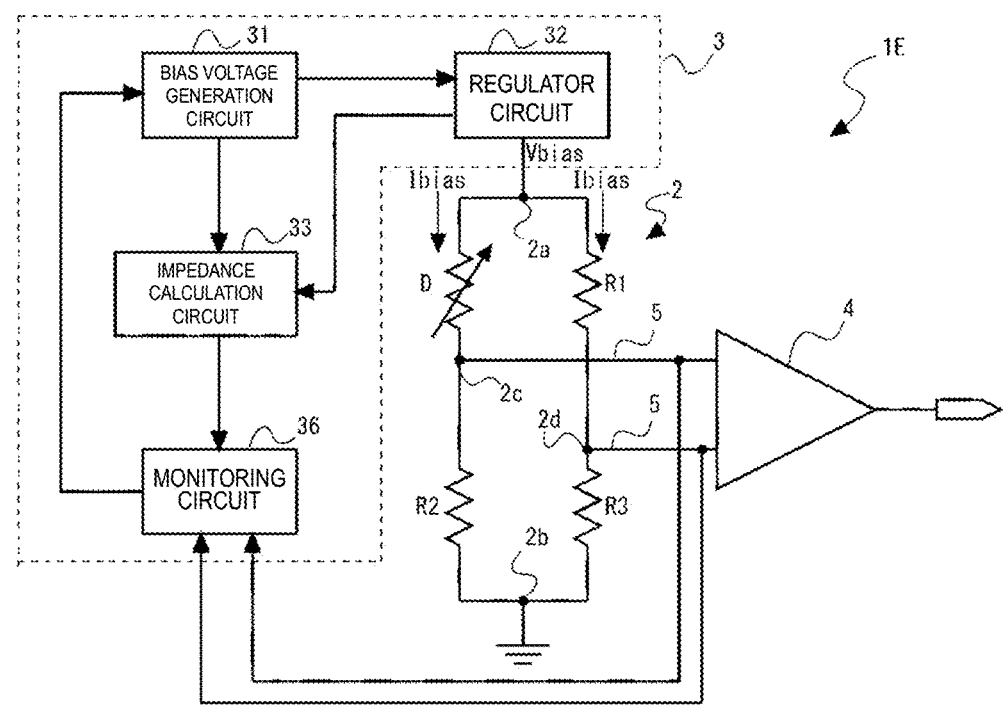
FIG. 5 is a circuit diagram illustrating the schematic configuration of a sensor device according to a fifth preferred embodiment of the present invention.

FIG. 5 is a circuit diagram illustrating the schematic configuration of a sensor device 1E according to a fifth preferred embodiment of the present invention. Referring to this drawing, the same reference numerals are used to identify the same components or equivalent components in FIG. 3 and the description of such components is omitted.

The sensor device 1E differs from the sensor device 1C according to the third preferred embodiment only in that the monitoring circuit 36 is connected to the signal input end of the detection signal reception circuit 4 and the abnormal state of the wiring line 5 between the bridge circuit 2 and the detection signal reception circuit 4 is monitored based on a voltage input to the signal input end of the detection signal reception circuit 4.

In the sensor device 1E, the monitoring circuit 36 monitors the abnormal state of the wiring line 5 between the bridge circuit 2 and the detection signal reception circuit 4 and can stop the application of the bias voltage Vbias or output a notification to a higher-level system as described above when monitoring that the abnormal state of the wiring line 5 has occurred. The sensor device 1E therefore outputs the accurate detection output signal S in accordance with the change in a physical quantity detected by the sensor element D without the deterioration of detection output accuracy even if the characteristics of the bridge circuit 2 change in accordance with a secular change thereof and also can prompt a quick response to the abnormal state of the wiring line 5 by, for example, outputting a notification when the abnormal state of the wiring line 5 is monitored. Furthermore, also when the monitoring circuit 36 detects the failure of the bridge circuit 2 based on the impedance Z of the bridge circuit 2, the sensor device 1E can prompt a quick response to the failure by, for example, stopping the application of the bias voltage Vbias or outputting a notification to a higher-level system.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A sensor device comprising:
    a bridge circuit including at least one sensor, characteristics of which change in accordance with a detected physical quantity;
    a detection signal reception circuit to receive a sensor detection signal that is output from a detection signal output end of the bridge circuit in accordance with a change in characteristics of the sensor;
    a bias voltage generation circuit to generate a bias voltage required for an operation of the bridge circuit;
    a regulator circuit to apply the bias voltage generated by the bias voltage generation circuit to a bias end of the bridge circuit and monitor bias current supplied to the bridge circuit;
    an impedance calculation circuit to receive a value of the bias voltage generated by the bias voltage generation circuit and a value of the bias current monitored by the regulator circuit and calculate an impedance of the bridge circuit; and
    a bias voltage correction circuit to cause, based on the impedance of the bridge circuit calculated by the impedance calculation circuit, the bias voltage generated by the bias voltage generation circuit to be corrected to a voltage that compensates for the change in characteristics of the bridge circuit.

2. The sensor device according to claim 1, wherein the bias voltage correction circuit is operable to detect a temperature of the bridge circuit based on the impedance of the bridge circuit calculated by the impedance calculation circuit and cause, based on the detected temperature of the bridge circuit, the bias voltage generated by the bias voltage generation circuit to be corrected to the voltage that compensates for the change in characteristics of the bridge circuit due to a temperature change.

3. The sensor device according to claim 1, wherein the bias voltage correction circuit is operable to detect a secular change of the bridge circuit based on the impedance of the bridge circuit calculated by the impedance calculation circuit and causes, based on the detected secular change of the bridge circuit, the bias voltage generated by the bias voltage generation circuit to be corrected to the voltage that compensates for the change in characteristics of the bridge circuit due to a secular change.

4. The sensor device according to claim 3, wherein the bias voltage correction circuit is operable to detect a failure of the bridge circuit based on the impedance of the bridge circuit calculated by the impedance calculation circuit.

5. The sensor device according to claim 1, wherein the bias voltage correction circuit is connected to a signal input end of the detection signal reception circuit to monitor an abnormal state of a wiring line between the bridge circuit and the detection signal reception circuit based on a voltage input to the signal input end of the detection signal reception circuit.

6. The sensor device according to claim 1, wherein the bridge circuit includes resistors bridge connected to the sensor.

7. The sensor device according to claim 1, wherein the at least one sensor includes four sensors that are bridge-connected.

8. The sensor device according to claim 1, wherein the at least one sensor includes a magnetic resistor having an electrical resistance value that changes with a change in an ambient magnetic field due to a magnetic resistance effect.

9. The sensor device according to claim 1, further comprising a first node between the at least one sensor and a first resistor to define a first bias end, and a second node between second and third resistors to define a second bias end connected to ground.

10. The sensor device according to claim 1, wherein the detection signal reception circuit includes an amplification circuit to receive and amplify the sensor detection signal and output an analog detection output signal.

11. The sensor device according to claim 1, wherein the bridge circuit defines and functions as a multiplication circuit alternative to a variable gain amplification circuit.

12. The sensor device according to claim 1, wherein the bias voltage correction circuit is defined by a bridge temperature estimation circuit.

13. The sensor device according to claim 12, wherein the bridge temperature estimation circuit is connected to a signal input end of the detection signal reception circuit and an abnormal state of a wiring line between the bridge circuit and the detection signal reception circuit is monitored based on a voltage input to the signal input end of the detection signal reception circuit.

14. The sensor device according to claim 1, wherein the bias voltage correction circuit is defined by a monitoring circuit.

15. The sensor device according to claim 14, wherein the monitoring circuit is connected to a signal input end of the detection signal reception circuit and an abnormal state of a wiring line between the bridge circuit and the detection signal reception circuit is monitored based on a voltage input to the signal input end of the detection signal reception circuit.

\* \* \* \* \*